(12) United States Patent
Jamneala et al.

(10) Patent No.: US 7,501,912 B2
(45) Date of Patent: Mar. 10, 2009

(54) GENERAL MATCHING NETWORK FOR ACOUSTIC WAVE FILTERS AND ACOUSTIC RESONATORS

(75) Inventors: Tiberiu Jamneala, San Francisco, CA (US); Paul Bradley, Los Altos, CA (US); Michael Frank, Menlo Park, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 238 days.

(21) Appl. No.: 11/505,453

(22) Filed: Aug. 17, 2006

(65) Prior Publication Data

US 2008/0042778 A1   Feb. 21, 2008

(51) Int. Cl.
*H03H 7/46* (2006.01)
(52) U.S. Cl. ........................ 333/132; 333/193
(58) Field of Classification Search ......... 333/132–134, 333/193–196
See application file for complete search history.

(56) References Cited

U.S. PATENT DOCUMENTS

| | | | | |
|---|---|---|---|---|
| 6,222,426 B1 * | 4/2001 | Komazaki et al. | ........... | 333/133 |
| 6,313,715 B1 * | 11/2001 | Bergmann et al. | .......... | 333/133 |
| 7,057,472 B2 * | 6/2006 | Fukamachi et al. | ......... | 333/101 |
| 7,295,814 B2 * | 11/2007 | Yamashita et al. | ............ | 455/83 |
| 2006/0067254 A1 | 3/2006 | Mahbub | | |

FOREIGN PATENT DOCUMENTS

| | | |
|---|---|---|
| EP | 1758247 | 2/2007 |
| GB | 2378067 | 1/2003 |
| JP | 416014 | 1/1992 |
| JP | 4016014 | 1/1992 |
| JP | 10313229 | 11/1998 |
| JP | 1168512 | 3/1999 |
| JP | 11068512 | 3/1999 |
| JP | 2003/347898 | 12/2003 |
| WO | WO-98/51010 | 11/1998 |
| WO | WO-2006/040927 | 10/2004 |

* cited by examiner

*Primary Examiner*—Don P Le

(57) ABSTRACT

A method and circuit matches a device to n filters, wherein each filter is a SAW filter, BAW filter, or FBAR filter. The method and system: (a) provide an inductor or transmission line connected between a common terminal and ground; (b) provide a plurality of capacitance values ($C_{1m}, C_{2m}, \ldots, C_{nm}$) each corresponding to one of the n filters; and (c) for each of the n filters, directly connect a first terminal of the filter to either: (1) the common terminal, or (2) a first terminal of a corresponding capacitor having the correspondence capacitance value calculated in step (b), where a second terminal of the corresponding capacitor is directly connected to the common terminal.

9 Claims, 4 Drawing Sheets

GENERAL MATCHING NETWORK FOR ACOUSTIC WAVE FILTERS AND ACOUSTIC RESONATORS

BACKGROUND

There is an increasing demand for communication devices capable of operating across a variety of different frequency bands. In particular, there is an increasing demand for cellular or mobile telephones that can operate in multiple frequency bands. In such devices, separate transmit and receive filters are in general employed for each transmit and receive frequency band. In practice, bulk acoustic wave (BAW) filters, surface acoustic wave (SAW) filters, and thin film bulk acoustic resonator (FBAR) filters are in general employed.

In these multi-band devices, there is a need to connect the various RF filters to an antenna. A switching multiplexer can be employed, but such arrangement can be complex and add cost. To simplify the arrangement and reduce the size and cost, a passive matching network may be employed instead of a switching multiplexer.

In the simple case of a duplexer, a single transmission line matching network is often employed. The transmit (Tx) and receive (Rx) filters are matched by series and/or shunt transmission lines, depending on the proximity of the frequency bands with respect to each other, and the topology of each filter. For example, if the bands are close in frequency (e.g., separated in frequency by 1% or less) such as for personal communications services, code division multiple access (PCS-CDMA), a 90° (quarter wavelength) series transmission line is often placed in front of the Rx filter. If the bands have a larger frequency separation, then shunt transmission lines of various lengths may also achieve good matching.

The complexity of the matching network increases with the number of filters. A common approach is encountered when the matching network is embedded with the filters into a multiplexer, for instance by the filter designer. In that case, in general the matching network is then empirically designed with transmission lines and various lumped elements. Once the matching components and filter topologies are chosen, an RF simulator can be employed to optimize the component values for best performance.

While this is a practical approach that can produce good results, it is nevertheless risky because it can use too many matching components and is not guaranteed to produce acceptable results.

FIG. 1 shows an exemplary multi-band multiplexer with RF matching network employing series and shunt transmission lines. The multiplexer of FIG. 1 is a Universal Mobile Telecommunications System/Korean Personal Communication Services (UMTS/KPCS) quadplexer (four frequency bands) for the UMTS Tx band (1920-1980 MHz), UMTS Rx band (2110-2170 MHz), KPCS Tx band (1750-1780 MHz), and KPCS Rx band (1840-1870 MHz). The filters for the arrangement of FIG. 1 are FBAR filters.

However, the arrangement of FIG. 1 has some drawbacks. The arrangement includes a large number of components. The transmission lines are long and lossy. Also, the transmission lines have to be isolated by the rest of the components. Thus, top and bottom ground planes are employed, and therefore a four-layer printed circuit board (PCB) is used, increasing the cost and complexity of the arrangement.

What is needed, therefore, is a general matching network and method of matching an antenna or other device to a plurality of BAW, SAW, and/or FBAR filters than can alleviate one or more of these shortcomings.

SUMMARY

In an example embodiment, a radio frequency (RF) signal processing device comprises a common terminal, a plurality of filters, a plurality of matching capacitors corresponding to the plurality of filters, and an inductor or transmission line connected between the common terminal and ground, and. Each of the filters is a surface acoustic wave (SAW) filter, a bulk acoustic wave (BAW) filter, or a thin film bulk acoustic resonator (FBAR) filter. Each matching capacitor has a first electrode directly connected to the corresponding filter. The second electrodes of all of the matching capacitors are directly connected together to the common terminal.

In another example embodiment, a radio frequency (RF) signal processing device comprises: a common terminal; n filters, where n>2; and an inductor or transmission line connected between the common terminal and ground. Each of the filters is a surface acoustic wave (SAW) filter, a bulk acoustic wave (BAW) filter, or a thin film bulk acoustic resonator (FBAR) filter. Each filter has first and second terminals, wherein the first terminal of each filter is directly connected to either: (1) the common terminal, or (2) a first terminal of a corresponding matching capacitor, where a second terminal of the corresponding matching capacitor is directly connected to the common terminal.

In yet another example embodiment, a method matches a device to a plurality (n) of filters each having first and second terminals, wherein each of the filters is a surface acoustic wave (SAW) filter, a bulk acoustic wave (BAW) filter, or a thin film bulk acoustic resonator (FBAR) filter. The method comprises: (a) providing an inductor or transmission line connected between a common terminal and ground; (b) determining a plurality of capacitance values $(C_{1m}, C_{2m}, \ldots, C_{nm})$ each corresponding to one of the n filters; and (c) for each of the n filters, directly connecting the first terminal of the filter to either: (1) the common terminal, or (2) a first terminal of a corresponding matching capacitor having the correspondence capacitance value calculated in step (b), where a second terminal of the corresponding matching capacitor is directly connected to the common terminal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Figure 2:
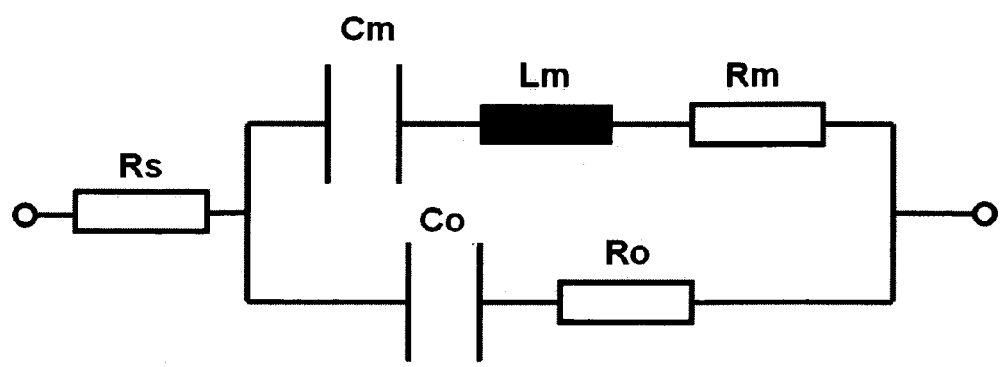
FIG. 2 shows a model of a bulk acoustic wave (BAW) or thin film bulk acoustic resonator (FBAR)

FIG. 2 shows a model of a bulk acoustic wave (BAW) or thin film bulk acoustic resonator (FBAR). The model of FIG. 2 is a modified Butterworth-Van Dyke model (MBVD) model. For a high quality resonator (resistance values Rs, Ro, and Rm are small), and for frequencies far away from the resonance/anti-resonance frequency of the resonator, the equivalent circuit becomes that of a single capacitor. This simplification is appropriate so long as the separation between the multiplexed frequency bands is sufficient. So, for example, this simplification would not be appropriate for a case where two or more frequency bands are extremely close to each other (e.g., PSC-CDMA Tx and Rx bands). Also, the model of FIG. 2 does not strictly apply for a SAW resonator, but the SAW resonator can also be simplified to a single capacitor under generally the same conditions as a BAW or FBAR device as mentioned above.

Figure 3A:
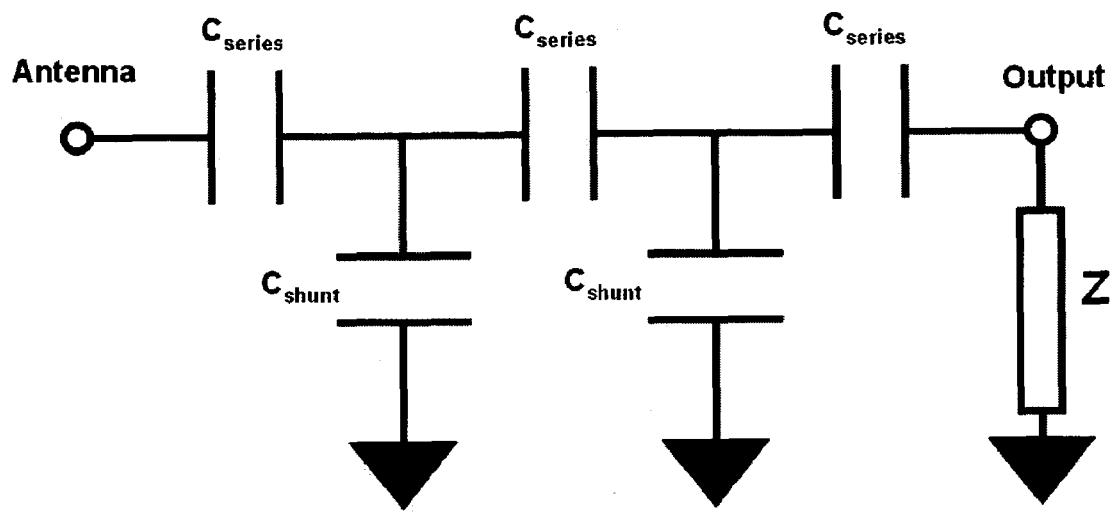
FIG. 3A shows a model of a BAW or FBAR filter.

Meanwhile, a SAW, BAW, or FBAR filter comprises series and shunt resonators. FIG. 3A shows a model of a BAW or FBAR filter. As can be seen in FIG. 3A, the filter can be modeled as a capacitor network.

Figure 3B:
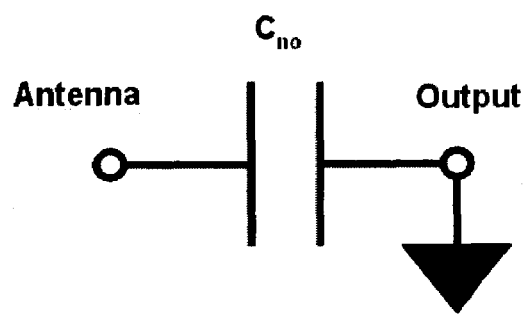
FIG. 3B illustrates the model of FIG. 3A as seen at an input port to the filter.

FIG. 3B illustrates the model of FIG. 3A as seen at an input port to the filter. Since each filter comprises at least four series and shunt resonators, the effect of the output port impedance as seen by the antenna can be ignored. Accordingly, the entire filter can be modeled as a capacitor to ground.

Figure 4:
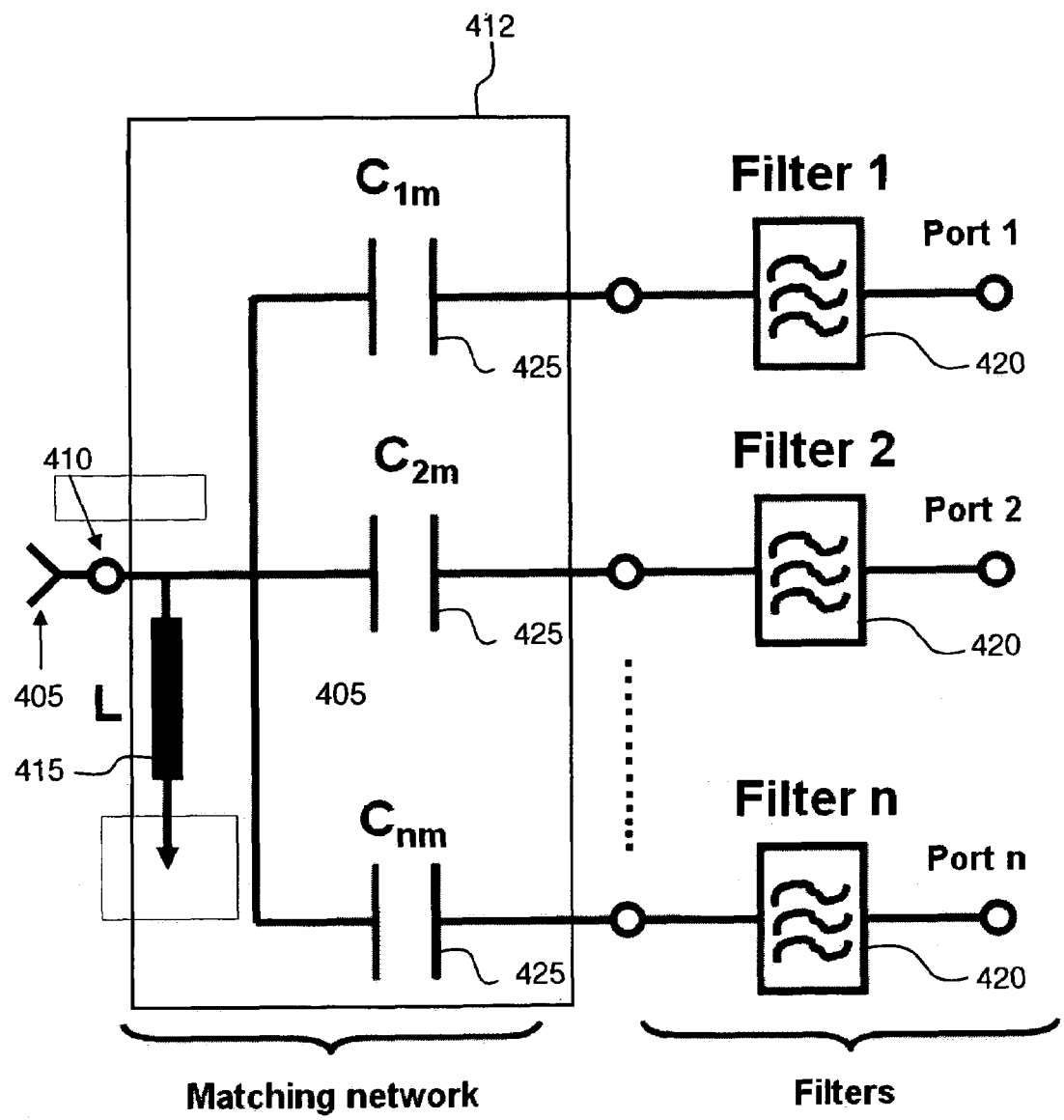
FIG. 4 shows one embodiment of a radio frequency (RF) signal processing device including a general RF matching network.

FIG. 4 shows one embodiment of a radio frequency (RF) signal processing device 400 including a general RF matching network. The arrangement of FIG. 4 includes an antenna 405, a common terminal 410, a plurality (n) of filters 420, and a multiplexing matching network 412. Matching network 412 includes a shunt inductor 415 and a plurality (n) of matching capacitors 425, corresponding to the plurality of filters 420. Antenna 405 is connected to common terminal 410.

Inductor 415 is directly connected between common terminal 410 and ground. Shunt inductor 415 may be replaced by a shunt transmission line. Each matching capacitor 425 has a first electrode directly connected to the corresponding filter 420, and a second electrode directly connected to the common terminal with the second terminals of all of the other capacitors 425. Each matching capacitor 425 has a corresponding capacitance value, $C_{im}$, where $i \in \{1, n\}$.

Figure 1:
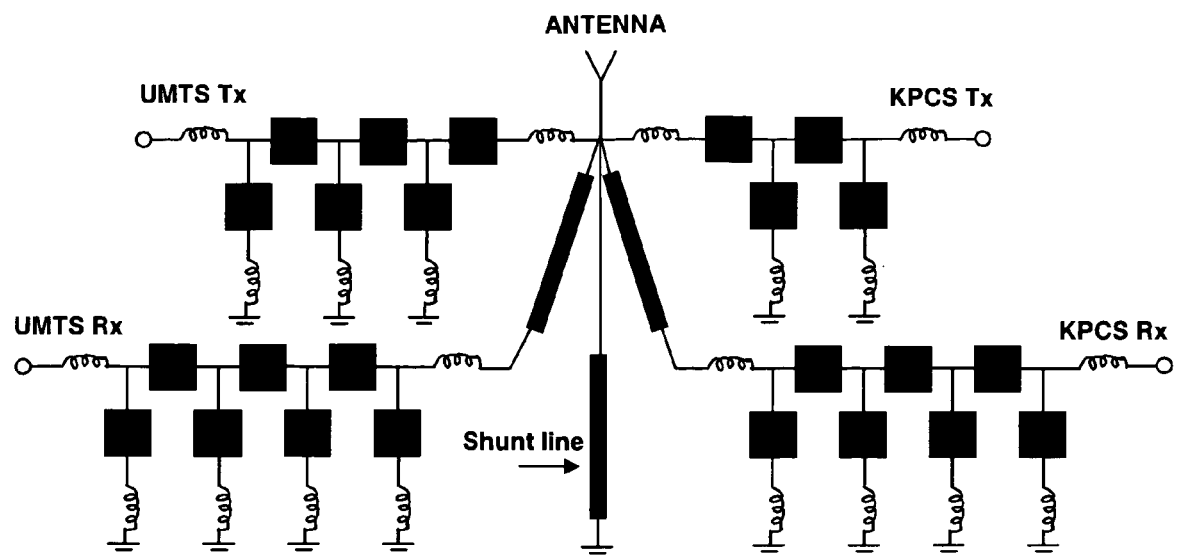
FIG. 1 shows an exemplary multi-band multiplexer with RF matching network employing series and shunt transmission lines.

In contrast to the arrangement shown in FIG. 1, in the embodiment of FIG. 4 the complexity of matching network 412 increases only linearly with an increase in the number of frequency bands. The addition of each filter 420 requires just one additional matching capacitor 425.

The arrangement of FIG. 4 has particular utility in the case where n>2, and indeed, as more and more filters 420 are included, the arrangement becomes increasingly powerful, especially compared to arrangements such as that illustrated in FIG. 1.

Figure 5:
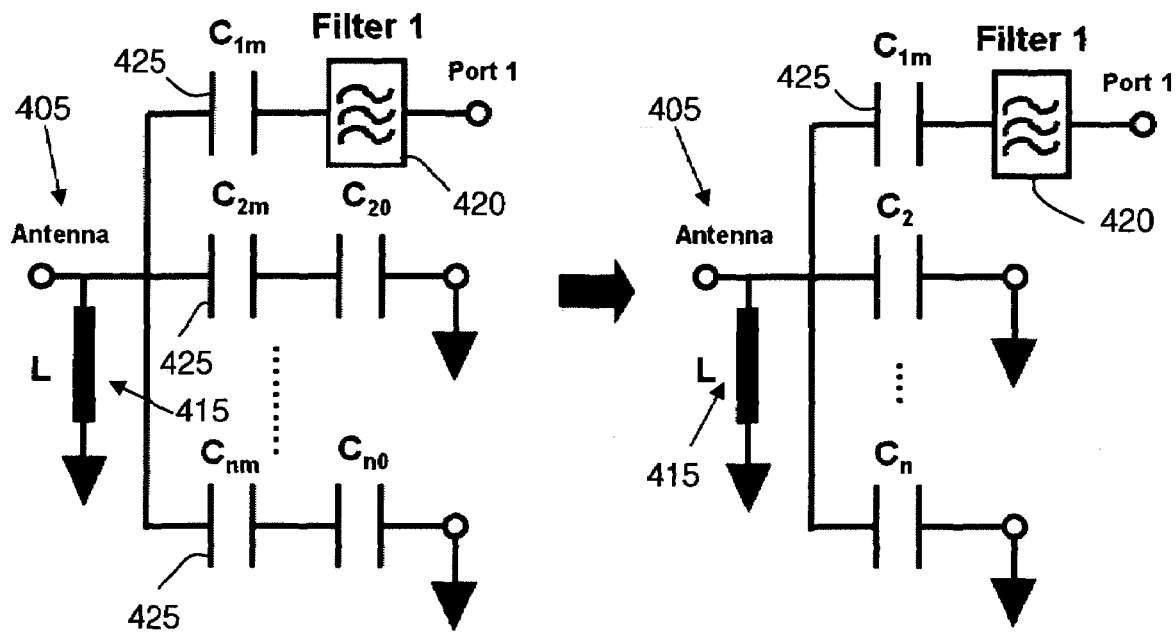
FIG. 5 shows a model of the RF signal processing of FIG. 4 for frequencies in the passband of the first filter.

FIG. 5 shows a model of the RF signal processing device 400 for frequencies in the passband of the first filter 420 (Filter 1). At these frequencies, the remaining filters 420, (Filter 2 through Filter n) are far enough away from their passbands such that they each can be approximated as a capacitor $C_{i0}$ to ground. In this case, only the first branch of the matching network 412 connected to Filter 1 420 should have a filtering function, while the remaining "off" branches connected to Filter 2 through Filter n should present a high impedance.

The equivalent capacitance of all of the "off" branches in general increases with the number of filters 420, since more matching capacitors 425 are added to the total. Hence, in general, a smaller shunt inductance L is required at common terminal 410 as additional filters 420 are included. A smaller shunt inductance L has a practical benefit in that in general it can be built with a higher quality factor, takes up less space, and has better electrostatic discharge (ESD) protection.

Given the matching network of FIG. 4 and the center passband frequencies, $(F_1, F_2, \ldots F_n)$, of each of the filters 420, then values must be selected for inductor 415 and each of the matching capacitors 425.

As a first condition, the value L of inductor 415 should be selected such that its impedance is as large as possible for all frequencies in the passband of the "ON" branch, given a desired filter quality ("Q") factor. This helps insure that the signal will only pass through the "ON" branch.

Next, the matching conditions can be grouped into a system of n equations solving for n+1 variables:

$$(2\pi F_1)^2 L(0 + C_2 + C_3 + \ldots + C_{n-1} + C_n) = 1;$$ (1)

$$(2\pi F_2)^2 L(C_1 + 0 + C_3 + \ldots + C_{n-1} + C_n) = 1; \ldots$$

$$\ldots$$

$$(2\pi F_n)^2 L(C_1 + C_2 + \ldots + C_{n-1} + 0) = 1,$$

wherein $C_i = (C_{im} * C_{i0})/(C_{im} + C_{i0})$, and wherein $C_{i0}$ is the equivalent capacitance value of filter i outside of its passband.

With (n+1) variables and only n constraints, there are multiple solutions to equations (1). For example, if $(C_{1x}, C_{2x}, \ldots C_{nx}, L_x)$ is a solution to equation (1), then $(qC_{1x}, qC_{2x}, \ldots qC_{nx}, qL_x)$ will also be a solution, where q can be an arbitrary number. Of course only those solutions which produce values for L and $(C_1, C_2, \ldots C_n)$ that are all real and positive can actually be produced with real components in the matching network 412 of FIG. 4, and so only such values are of interest.

Equations (1) address the issues of isolation between frequency bands, but there is also a need to match each filter 420 to frequencies within its passband. If a filter 420 is already well matched and cannot be modified, (e.g., $C_{i0}$ fixed) then the greater the value $(C_{im})$ of the series matching capacitor 425, the less the effect will be on frequencies in the passband. Accordingly, one could choose a solution to equations (1) that have large values of capacitances $C_i$, and a corresponding small value for inductance L. Of course there is a limit to how large $C_i$ can be made, as it cannot exceed the intrinsic capacitance $C_{i0}$ of the filter 420.

If the filters 420 are designed together with the matching network 412, then additional design flexibility exists to select values of $C_i$ which provide isolation outside the passband, and good matching within the passband. An RF simulator can be employed to find an "optimum" solution, taking into account the out-of-band isolation requirements, and the in-band matching conditions, for all of the filters 420.

In that case, often one or more matching capacitors 425 in FIG. 4 can be eliminated by incorporating the corresponding capacitance value, $C_i$, within the corresponding filter 420. This reduces the number of components included in matching network 412, thereby reducing its size. In one embodiment of matching network 412 where it is a duplexer, the two matching capacitor 425 are incorporated within the corresponding filters 420, and matching network 412 comprises a single shunt inductor 415, which may be realized as a transmission line.

The method of matching a device to n filters has particular utility in the case where n>2, and indeed, as more and more filters 420 are included, the method becomes increasingly powerful.

It should be noted that filters 420 employing resonators with poor quality factors ("Q") can negatively impact the performance of a passive multiplexer including matching network 412—or any other matching network, for that matter. If any of the filters 420 exhibits severe acoustic or electrical loss at frequencies within the passband(s) of other filters 420, then the matching conditions (1) start to fail. This can limit the use of BAW or SAW filters for such multiplexers in some circumstances, because such devices function based on acoustic mirrors that in general do not maintain their reflective efficiency over very wide frequency ranges. On the other hand FBAR filters do not employ acoustic mirrors and can maintain good quality factors over a wide frequency range. Therefore, passive multiplexers employing FBAR filters can provide good broadband matching even for frequency bands having a very wide frequency separation.

Figure 6:
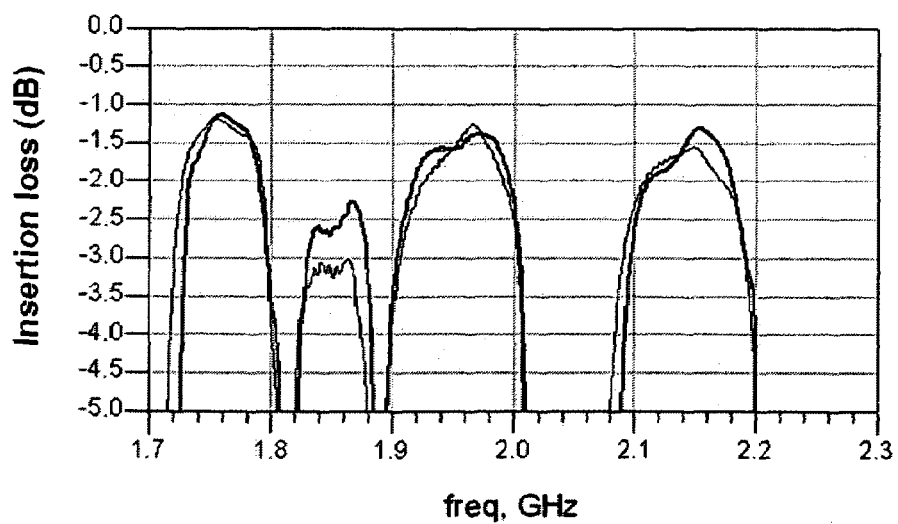
FIG. 6 compares the performance of the RF matching networks of FIGS. 1 and 4.

FIG. 6 compares the simulated performance of the RF matching networks of FIGS. 1 and 4 in the case of a UMTS/KPCS quadplexer (four frequency bands) for the UMTS Tx band (1920-1980 MHz), UMTS Rx band (2110-2170 MHz), KPCS Tx band (1750-1780 MHz), and KPCS Rx band (1840-1870 MHz). The thinner lines of FIG. 6 reflect the performance of the multiplexer of FIG. 1, while the thicker lines reflect the performance of the multiplexer 412 of FIG. 4. In the case of multiplexer 412, only two matching capacitors 425 were employed. Nevertheless, the performance is as good as or better than the performance of the matching network of FIG. 1.

While example embodiments are disclosed herein, one of ordinary skill in the art appreciates that many variations that are in accordance with the present teachings are possible and remain within the scope of the appended claims. For example, although the descriptions and figures above illustrate an exemplary case where a matching network multiplexes signals to and from an antenna and a plurality of filters, the matching network is not limited to use with an antenna. In general, any appropriate device, such as a broadband amplifier or filter, can be passively multiplexed with the plurality of filters using the matching network as described above. The embodiments therefore are not to be restricted except within the scope of the appended claims.

The invention claims is:

1. A radio frequency (RF) signal processing device, the device comprising:
   a common terminal;
   a plurality of filters, wherein each of the filters is one of a surface acoustic wave (SAW) filter, a bulk acoustic wave (BAW) filter, and a thin film bulk acoustic resonator (FBAR) filter;
   a plurality of matching capacitors corresponding to the plurality of filters, each capacitor having a first electrode directly connected to the corresponding filter and having a second electrode, wherein the second electrodes of all of the matching capacitors are directly connected together to the common terminal; and
   one of an inductor and a transmission line connected between the common terminal and ground,
   wherein capacitance values $(C_{1m}, C_{2m}, \ldots, C_{nm})$ of the n matching capacitors solve the equations: $(2\pi F_1)^2 L(0+C_2+C_3+\ldots+C_{n-1}+C_n)=1$; $(2\pi F_2)^2 L(C_1+0+C_3+\ldots+C_{n-1}+C_n)=1$; $\ldots (2\pi F_n)^2 L(C_1+C_2+\ldots+C_{n-1}+0)=1$,
   wherein $C_i=(C_{im}*C_{i0})/(C_{im}+C_{i0})$,
   wherein $C_{i0}$ is the equivalent capacitance value of filter i outside of its passband,
   wherein L is an inductance value of the one of an inductor and a transmission line connected between the common terminal and ground, and
   wherein $(F_1, F_2, \ldots F_n)$ are center frequencies of the n filters.

2. The RF signal processing device of claim 1, further comprising an antenna connected to the common terminal.

3. The RF signal processing device of claim 2, wherein each of the matching capacitors is adapted to match an impedance of the antenna to an impedance of the corresponding filter.

4. The RF signal processing device of claim 1, wherein the matching capacitors isolate a signal in a corresponding passband of each of the filters from all of the other filters.

5. The RF signal processing device of claim 1, wherein the device includes a single layer printed circuit board on which are provided the common terminal, the plurality of filters, the plurality of matching capacitors, and the inductor or transmission line.

6. The RF signal processing device of claim 1, wherein there are n filters and n matching capacitors, where n>2.

7. A method of matching a device to a plurality (n) of filters each having first and second terminals, wherein each of the filters is one of a surface acoustic wave (SAVV) filter, a bulk acoustic wave (BAW) filter, and a thin film bulk acoustic resonator (FBAR) filter, the method comprising:
   (a) providing one of an inductor and a transmission line connected between a common terminal and ground;
   (b) determining a plurality of capacitance values $(C_{1m}, C_{2m}, \ldots, C_{nm})$ each corresponding to one of the n filters by solving the equations: $(2\pi F_1)^2 L(0+C_2+C_3+\ldots+C_{n-1}+C_n)=1$; $(2\pi F_2)^2 L(C_1+0C_3+\ldots+C_{n-1}+C_n)=1$; $\ldots (2\pi F_n)^2 L(C_1+C_2+\ldots+C_{n-1}+0)=1$,
   wherein $C_i=(C_{im}*C_{i0})/(C_{im}+C_{i0})$.
   wherein $C_{i0}$ is the equivalent capacitance value of filter i outside of its passband;
   wherein L is an inductance value of the one of an inductor and a transmission line connected between the common terminal and ground, and
   wherein $(F_1, F_2, \ldots F_n)$ are center frequencies of the n filters; and
   (c) for each of the n filters, directly connecting the first terminal of the filter to either: (1) the common terminal, or (2) a first terminal of a corresponding matching capacitor having the correspondence capacitance value calculated in step (b), where a second terminal of the corresponding matching capacitor is directly connected to the common terminal.

8. The method of claim 7, wherein when the first terminal of a filter is directly connected to the common terminal, and an input characteristic of the filter includes the corresponding capacitance value calculated in step (b).

9. The method of claim 7, where n>2.

* * * * *

UNITED STATES PATENT AND TRADEMARK OFFICE
CERTIFICATE OF CORRECTION

| | | |
|---|---|---|
| PATENT NO. | : 7,501,912 B2 | |
| APPLICATION NO. | : 11/505453 | |
| DATED | : March 10, 2009 | |
| INVENTOR(S) | : Michael Frank, Paul Bradley and Tiberiu Jamneala | |

It is certified that error appears in the above-identified patent and that said Letters Patent is hereby corrected as shown below:

Column 6, Line 36, Claim 7, delete "(SAVV)" and insert --(SAW)--.

Column 6, Line 43, Claim 7, delete "solvinq" and insert --solving--.

Column 6, Line 44, Claim 7, delete "$0C_3$" and insert --$0+C_3$--.

Column 6, Line 46, Claim 7, delete ")." and insert --),--.

Signed and Sealed this
Fourth Day of January, 2011

David J. Kappos
*Director of the United States Patent and Trademark Office*